(12) United States Patent
Sasaki

(10) Patent No.: US 7,030,940 B2
(45) Date of Patent: Apr. 18, 2006

(54) TUNER THAT SUPPRESSES OUTSIDE RADIATION OF INSIDE OSCILLATED SIGNAL

(75) Inventor: Michinori Sasaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 568 days.

(21) Appl. No.: 10/422,182

(22) Filed: Apr. 23, 2003

(65) Prior Publication Data
US 2003/0202126 A1 Oct. 30, 2003

(30) Foreign Application Priority Data
Apr. 24, 2002 (JP) .............................. 2002-121780

(51) Int. Cl.
| H04N 5/44 | (2006.01) |
| H04N 5/50 | (2006.01) |
| H04B 1/10 | (2006.01) |
| H04B 1/16 | (2006.01) |
| H05K 1/14 | (2006.01) |

(52) U.S. Cl. ...................... 348/731; 348/725; 348/733; 455/296; 455/334; 361/736

(58) Field of Classification Search ................ 348/607, 348/725, 731, 733; 455/296, 334, 300, 310, 455/192.1, 182.1; 361/736; H04N 5/44, H04N 5/50; H04B 1/10, 1/16; H05K 1/14
See application file for complete search history.

(56) References Cited

U.S. PATENT DOCUMENTS

| 4,862,515 | A | * | 8/1989 | Cowley ................... 455/183.1 |
| 5,050,238 | A | * | 9/1991 | Tomizuka et al. .......... 455/300 |
| 5,111,274 | A | * | 5/1992 | Tomizuka et al. .......... 257/659 |
| 6,052,571 | A | * | 4/2000 | Mishima et al. ............ 455/318 |
| 6,072,992 | A | * | 6/2000 | Mishima et al. .............. 455/76 |
| 6,226,503 | B1 | * | 5/2001 | Yamamoto et al. ...... 455/180.4 |
| 6,714,263 | B1 | * | 3/2004 | Cowley ....................... 348/731 |
| 6,853,542 | B1 | * | 2/2005 | Sasaki ......................... 361/679 |
| 6,876,402 | B1 | * | 4/2005 | Sasaki ......................... 348/731 |
| 6,917,390 | B1 | * | 7/2005 | Sasaki ......................... 348/731 |
| 2003/0220088 | A1 | * | 11/2003 | Cowley et al. ............. 455/292 |

FOREIGN PATENT DOCUMENTS

JP 2002-224007 8/2000

* cited by examiner

Primary Examiner—Brian P. Yenke
(74) Attorney, Agent, or Firm—Brinks Hofer Gilson & Lione

(57) ABSTRACT

An integrated circuit is mounted on a printed board in a state in which a first edge thereof is located to face to a first side of the printed board and a second edge adjacent to the first edge is located to face to a second side adjacent to the first side of the printed board. A power supply terminal provided on the first edge of the integrated circuit, an AGC terminal and an oscillator terminal respectively provided to a third edge are connected to external terminals via conductive patterns extended to the first side on the printed board. An electrode for measurement is provided in the vicinity of the second side on the printed board and an intermediate frequency output terminal provided on a second edge of the integrated circuit is connected to the electrode via a conductive pattern extended from the second edge to the second side on the printed board.

2 Claims, 1 Drawing Sheet

TUNER THAT SUPPRESSES OUTSIDE RADIATION OF INSIDE OSCILLATED SIGNAL

BACKGROUND OF THE INVENTION

1. Field of the Invention

The present invention relates to a television tuner, particularly relates to a television tuner that suppresses the outside radiation of an inside oscillated signal.

2. Description of the Related Art

FIG. 2 is a layout viewed from the top showing a conventional type television tuner. As shown in FIG. 2, a rectangular printed board 31 is housed in a metallic frame 32 that holds the four sides. A connector 33 to which a television signal is input is attached to one side face of the metallic frame 32. A high-frequency circuit 34, a first integrated circuit 35 and a second integrated circuit 36 are sequentially mounted on the printed board 31 from the side on which the connector 33 is attached toward the opposite side. The high-frequency circuit 34 is provided with a tuning circuit (not shown), a high frequency amplifying circuit 34a and others and is connected to the connector 33 to take a television signal. The high-frequency circuit selects a television signal to be received, amplifies and outputs it.

The first integrated circuit 35 is provided with four edges and inside it, a mixing circuit for converting an input television signal to an intermediate frequency signal, an intermediate frequency amplifying circuit that amplifies the intermediate frequency signal, an oscillation circuit that supplies a local oscillated signal to the mixing circuit, a PLL circuit that controls the frequency of the local oscillated signal, a reference oscillation circuit that supplies a reference signal to the PLL circuit and others (respectively not shown) are mounted. The first integrated circuit 35 is provided with terminals on two opposite edges and the terminals are mounted so that one edge is opposite to the high-frequency circuit 34 and the other edge is opposite to the second integrated circuit 36. An input terminal 35a of a television signal is provided to one edge and on the other edge, an intermediate frequency output terminal 35b for outputting an intermediate frequency signal, a power supply terminal 35c to which source voltage is supplied, an oscillator terminal 35d for connecting an oscillator provided outside (not shown) to the reference oscillation circuit and others are provided. The input terminal 35a is connected to the high-frequency circuit 34 via a conductive pattern 31a formed on the printed board 31.

Plural external terminals 37 are attached to the printed board 31 in the vicinity of the first side adjacent to the side on which the connector 33 is attached. The external terminals 37 are protruded from the metallic frame 32 outside and are connected to a mother board not shown. The intermediate frequency output terminal 35b of the first integrated circuit 35 is connected to the external terminal 37a for outputting an intermediate frequency signal via a conductive pattern 31b formed on the printed board 31, the power supply terminal 35c is connected to the external terminal 37b to which power is supplied via a conductive pattern 31c and the oscillator terminal 35d is connected to the external terminal 37c to which the oscillator is connected via a conductive pattern 31d. NF measurement equipment is connected to the external terminal 37a when a noise factor (NF) is measured. Source voltage is applied to the external terminal 37b. Source voltage is also supplied to the high-frequency circuit 34 via the conductive pattern 31c.

The second integrated circuit 36 is also provided with four edges and inside, a demodulating circuit, an AGC voltage generating circuit and others (none of them shown) are mounted. Terminals are provided on two opposite edges. The second integrated circuit 36 is mounted so that edges on which terminals are provided are perpendicular to the edges on which the terminals are mounted of the first integrated circuit, that is, one edge is opposite to a second side on the reverse side to the first side of the printed board 31 and the other edge is opposite to the first side. On one edge, an intermediate frequency input terminal 36a is provided and on the other edge, a power supply terminal 36b and an AGC terminal 36c for taking AGC voltage are provided.

An SAW filter 38 is mounted in the vicinity of the first integrated circuit 35 and the second integrated circuit 36 on the printed board 31 and is connected between the intermediate frequency output terminal 35b of the first integrated circuit 35 and the intermediate frequency input terminal 36a of the second integrated circuit 36 via the conductive pattern 31b. The power supply terminal 36b is connected to the power supply external terminal 37b via the conductive pattern 31c. The AGC terminal 36c is connected to the AGC external terminal 37d via a conductive pattern 31e, is also connected to the high-frequency circuit 34 and AGC voltage is supplied to the high frequency amplifying circuit 34a. The AGC external terminal 37d is used for monitoring.

In the configuration described above, each conductive pattern 31b, 31c, 31d, 31e crosses each other in a layout. For example, the conductive pattern 31b connected to the intermediate frequency external terminal 37a crosses the conductive pattern 31c connected to the power supply external terminal 37b, the conductive pattern 31d connected to the oscillator external terminal 37c and the conductive pattern 31e connected to the AGC external terminal 37d. In such an intersection, an insulating film is provided between the conductive patterns to prevent mutual contact.

As the oscillation circuit is provided in the first integrated circuit, a signal oscillated there is superimposed on the conductive pattern 31c that supplies source voltage and the conductive pattern 31d connected to the oscillator external terminal 37c. The signal is also superimposed on the conductive pattern 31b for taking an intermediate frequency signal which crosses these conductive patterns via these conductive patterns 31c, 31d. The oscillated signal is radiated outside from the external terminals. To prevent the radiation, the power supply external terminal is directly grounded via a capacitor by a bypass. However, a capacitor for a bypass cannot be connected to the intermediate frequency external terminal 37a because the capacitor has a bad effect upon the characteristic of an intermediate frequency signal. Therefore, there is a problem that the superimposed oscillated signal is radiated outside via the intermediate frequency external terminal 37a and the product does not meet standards such as the FCC Standard in the United States.

SUMMARY OF THE INVENTION

The object of the invention is to lower a level of an oscillated signal radiated from an intermediate frequency external terminal for measuring the noise factor.

A television tuner according to the invention is provided with a rectangular printed board, plural external terminals mounted along the vicinity of a first side of the printed board for connecting to external circuits and an integrated circuit having four edges for converting a television signal to an intermediate frequency signal and demodulating it. The integrated circuit is mounted on the printed board in a state in which a first edge thereof is located to face to the first side and a second edge adjacent to the first edge is located to face to a second side adjacent to the first side of the printed board. There are provided a power supply terminal, to the first edge, for supplying source voltage to the integrated circuit, an intermediate frequency output terminal, to the second edge, for taking the intermediate frequency signal and, to a third edge adjacent to the first edge, an AGC terminal for taking AGC voltage generated in the integrated circuit and an oscillator terminal for connecting an oscillator to a reference oscillation circuit, in the integrated circuit. The power supply terminal, the AGC terminal and the oscillator terminal are respectively connected to the external terminals via each conductive pattern extended from the first edge and the third edge to the first side on the printed board. An electrode for measurement is provided in the vicinity of the second side on the printed board. The intermediate frequency output terminal is connected to the electrode via a conductive pattern extended from the second edge to the second side on the printed board.

The television tuner according to the invention is also provided with a metallic frame for housing the printed board, a protrusion protruded outside the metallic frame on the second side is provided to the printed board and the electrode is provided to the protrusion.

DETAILED DESCRIPTION OF THE PREFERRED EMBODIMENT

Figure 1:
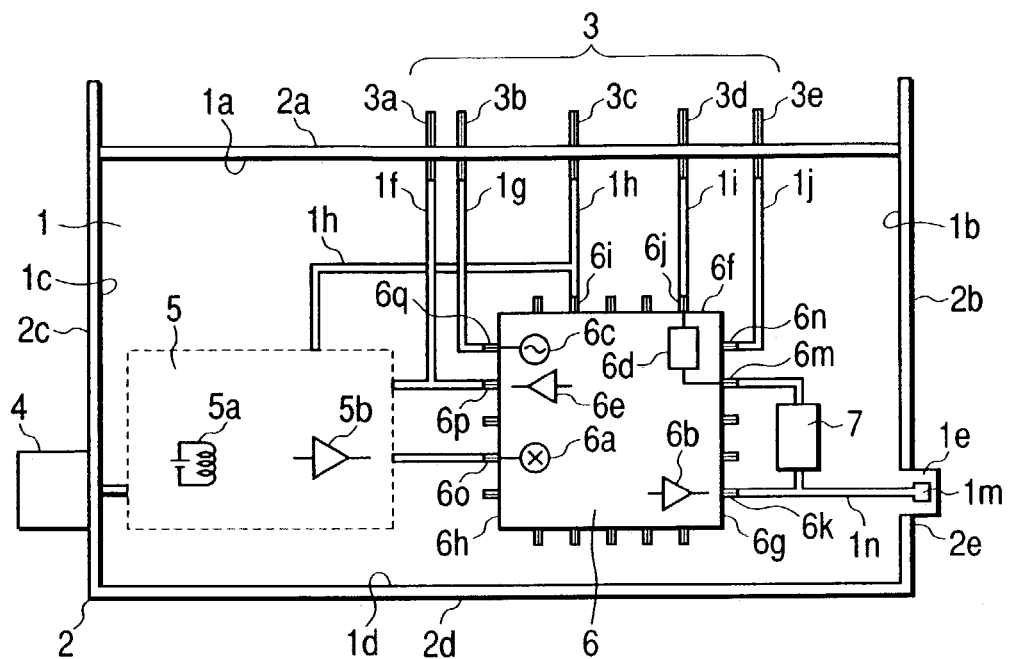
FIG. 1 is a plan showing the layout of the inside of a television tuner according to the invention.
Figure 2:
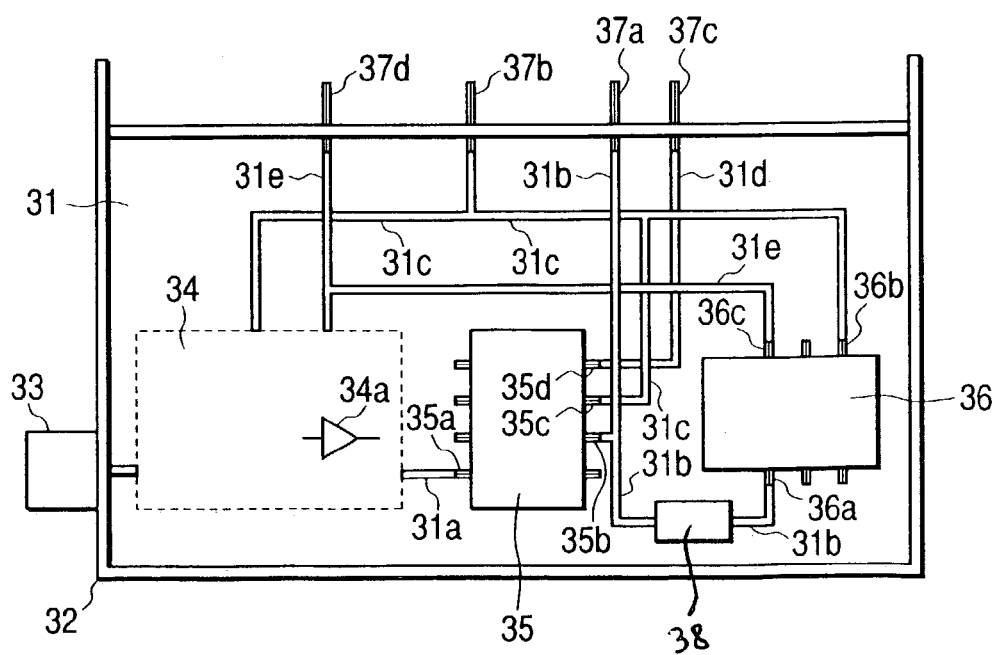
FIG. 2 is a plan showing the layout of the inside of a conventional type television tuner.

FIG. 1 is a layout viewed from the top showing a television tuner according to the invention. As shown in FIG. 1, a rectangular printed board 1 is housed in a metallic frame 2. A first side 1a, a second side 1b adjacent to the first side 1a, a third side 1c and a fourth side 1d opposite to the first side 1a respectively of the printed board 1 are held by a first side plate 2a, a second side plate 2b, a third side plate 2c and a fourth side plate 2d respectively of the metallic frame 2. Plural external terminals 3 (an external terminal 3a for taking a signal for AGC, an external terminal 3b connected to an oscillator, an external terminal 3c for supplying source voltage, an external terminal 3d for taking an aural signal and an external terminal 3e for taking a video signal) are attached to the vicinity of the first side 1a of the printed board 1 along the first side 1a, and the terminals 3 are all protruded outside from the first side plate 2a. These terminals 3 are connected to a mother board (not shown). A cut-out hole 2e is provided to the second side plate 2b and a protrusion 1e which is a part of the printed board is protruded outside from the cut-out hole 2e. A connector 4 to which a television signal is input is attached to the third side plate 2c.

A high-frequency circuit 5, an integrated circuit 6 and an SAW filter 7 are sequentially mounted from the third side 1c toward the second side 1b on the printed board 1. The high-frequency circuit 5 is provided with a tuning circuit 5a, a high frequency amplifying circuit 5b and others, and is connected to the connector 4 to take a television signal. The high-frequency circuit selects a television signal to be received, amplifies and outputs it.

The integrated circuit 6 is provided with four edges and terminals are provided to each edge. Inside the integrated, circuit, there are mounted a mixing circuit 6a for frequency-converting an input television signal to an intermediate frequency signal, an intermediate frequency amplifying circuit 6b that amplifies the intermediate frequency signal, an oscillation circuit (not shown) that supplies a local oscillated signal to the mixing circuit 6a, a PLL circuit (not shown) that controls the frequency of the local oscillated signal, a reference oscillation circuit 6c that supplies a reference signal to the PLL circuit, a demodulating circuit 6d that demodulates the intermediate frequency signal and an AGC voltage generating circuit 6e. The integrated circuit 6 is mounted on the printed board 1 in a state in which a first edge 6f is opposite to the first side 1a of the printed board 1, a second edge 6g is opposite to the second side 1b and a third edge 6h is opposite to the third side 1c.

A power supply terminal 6i that supplies source voltage to the integrated circuit 6, an audio terminal 6j that outputs an aural signal and others are provided to the first edge 6f of the integrated circuit 6, an IF output terminal 6k that outputs an intermediate frequency signal, an IF input terminal 6m that receives an intermediate frequency signal, a video terminal 6n that outputs a video signal and others are provided to the second edge 6g, and an RF input terminal 6o to which a television signal is input, an AGC terminal 6p that outputs AGC voltage and an oscillator terminal 6q for connecting the oscillator (not shown) to the reference oscillation circuit 6c are provided to the third edge 6h.

Conductive patterns 1f to 1j for connecting the external terminals 3a to 3e and the terminals 6p, 6q, 6i, 6j, 6n of the integrated circuit 6 are provided on the printed board 1. The conductive patterns 1f to 1j are extended from the first edge 6f and the third edge 6h of the integrated circuit 6 to the first side 1a of the printed board 1. The power supply terminal 6i of the integrated circuit 6 is connected to the external terminal 3c via the conductive pattern 1h, the audio terminal 6j is connected to the external terminal 3d via the conductive pattern 1i, the video terminal 6n is connected to the external terminal 3e via the conductive pattern 1j, the AGC terminal 6p is connected to the external terminal 3a via the conductive pattern 1f, and the oscillator terminal 6q is connected to the external terminal 3b via the conductive pattern 1g.

The conductive patterns 1f and 1h are also connected to the high-frequency circuit 5. The high frequency amplifying circuit 5b of the high-frequency circuit 5 is connected to the mixing circuit 6a of the integrated circuit 6 via a conductive pattern 1k.

Further, an electrode 1m to be a terminal is provided to the protrusion 1e of the printed board 1 and is connected to the IF output terminal 6k via the conductive pattern 1n. The conductive pattern 1n is extended from the second edge 6g of the integrated circuit 6 to the second side 1b of the printed board 1. The SAW filter 7 is connected between the IF output terminal 6k of the integrated circuit 6 and the IF input terminal 6m.

In the configuration described above, source voltage is supplied to the high-frequency circuit 5 and the integrated circuit 6 via the conductive pattern 1h, AGC voltage output from the integrated circuit 6 is supplied to the high frequency amplifying circuit 5b of the high-frequency circuit 5 via the conductive pattern 1f and is also output to the external terminal 3a. Therefore, AGC voltage can be monitored via the external terminal 3a. A television signal input to the mixing circuit 6a of the integrated circuit 6 from the high-frequency circuit 5 is converted to an intermediate frequency signal by the mixing circuit 6a. The intermediate frequency signal output from the mixing circuit 6a is input to the integrated circuit 6 again via the SAW filter 7 provided outside the integrated circuit 6, is demodulated by the demodulating circuit 6d, and an aural signal and a video signal are output. An intermediate frequency signal output from the IF output terminal 6k is extracted from the electrode 1m. Measurement equipment is connected to the electrode 1m when the performance of a television tuner is measured so as to enable the measurement of a noise figure for example.

In the configuration, the conductive pattern 1n for taking an intermediate frequency signal does not-cross the conductive pattern 1h for supplying source voltage, the conductive pattern 1g for connecting the oscillator and the conductive pattern 1f for taking AGC voltage. Therefore, no oscillated signal is superimposed on the conductive pattern 1n and is radiated from the conductive pattern 1n.

As described above, as the integrated circuit is mounted on the printed board in the state in which the first edge thereof is located to face to the first side of the printed board and the second edge adjacent to the first edge is located to face to the second side adjacent to the first side of the printed board, the power supply terminal provided to the first edge of the integrated circuit, the AGC terminal and the oscillator terminal respectively provided to the third edge are respectively connected to external terminals via each conductive pattern extended on the first side on the printed board, the electrode for measurement is provided in the vicinity of the second side on the printed board and the intermediate frequency output terminal provided to the second edge of the integrated circuit is connected to the electrode via the conductive pattern extended from the second edge to the second side on the printed board, the conductive pattern for taking an intermediate frequency signal does not cross the conductive pattern for supplying source voltage, the conductive pattern for connecting the oscillator and the conductive pattern for taking AGC voltage. Therefore, no oscillated signal is superimposed on the conductive pattern for taking the intermediate frequency signal and is radiated from the conductive pattern.

In addition, measurement equipment can be easily connected to the electrode when the performance is measured because the metallic frame for housing the printed board is provided, the protrusion protruded outside the metallic frame is provided to the printed board on the second side and the electrode is provided to the protrusion.

What is claimed is:

1. A television tuner, comprising:
   a rectangular printed board;
   plural external terminals mounted along a vicinity of a first side of the printed board for connecting to external circuits; and
   an integrated circuit having four edges for converting a television signal to an intermediate frequency signal and demodulating the intermediate frequency signal, wherein
   the integrated circuit is mounted on the printed board in a state in which a first edge thereof is located to face to the first side and a second edge adjacent to the first edge is located to face to a second side adjacent to the first side of the printed board,
   wherein there are provided a power supply terminal, to the first edge, for supplying source voltage to the integrated circuit, an intermediate frequency output terminal, to the second edge, for taking the intermediate frequency signal and, to a third edge adjacent to the first edge, an AGC terminal for taking AGC voltage generated in the integrated circuit and an oscillator terminal for connecting an oscillator to a reference oscillation circuit in the integrated circuit,
   wherein the power supply terminal, the AGO terminal and the oscillator terminal are respectively connected to the external terminals via each conductive pattern extended from the first edge and the third edge to the first side on the printed board;
   wherein an electrode for measurement is provided in a vicinity of the second side on the printed board; and
   wherein the intermediate frequency output terminal is connected to the electrode via a conductive pattern extended from the second edge to the second side on the printed board.

2. A television tuner according to claim 1, comprising:
   a metallic frame for housing the printed board, wherein:
   a protrusion protruded outside the metallic frame on the second side is provided to the printed board; and
   wherein the electrode is provided to the protrusion.

* * * * *